(12) United States Patent
Tsuchida et al.

(10) Patent No.: US 10,849,221 B2
(45) Date of Patent: Nov. 24, 2020

(54) ELECTRODE EMBEDDED MEMBER

(71) Applicant: NGK SPARK PLUG CO., LTD., Nagoya (JP)

(72) Inventors: Atsushi Tsuchida, Sendai (JP); Noriaki Tokusho, Tsuruoka (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 283 days.

(21) Appl. No.: 16/173,028

(22) Filed: Oct. 29, 2018

(65) Prior Publication Data
US 2019/0132949 A1    May 2, 2019

(30) Foreign Application Priority Data

Oct. 30, 2017  (JP) ................... 2017-209382
Apr. 6, 2018   (JP) ................... 2018-073635
Sep. 21, 2018  (JP) ................... 2018-177024

(51) Int. Cl.
*H05K 1/18* (2006.01)
*H05K 1/03* (2006.01)
*H05K 1/02* (2006.01)
*H01L 23/488* (2006.01)
*H05K 3/40* (2006.01)

(52) U.S. Cl.
CPC ......... *H05K 1/0306* (2013.01); *H01L 23/488* (2013.01); *H05K 1/0271* (2013.01); *H05K 1/186* (2013.01); *H05K 3/4015* (2013.01)

(58) Field of Classification Search
CPC .... H05K 1/0306; H05K 1/0271; H05K 1/186; H05K 3/4015; H01L 23/488
USPC ........................................... 174/250
See application file for complete search history.

(56) References Cited

U.S. PATENT DOCUMENTS

| 2006/0169688 A1* | 8/2006 | Mori ................ H01L 21/68757 219/444.1 |
| 2008/0116187 A1* | 5/2008 | Sugimoto ......... H01L 21/67103 219/200 |
| 2016/0007447 A1* | 1/2016 | Funahashi ............ H05K 1/0306 348/375 |

FOREIGN PATENT DOCUMENTS

JP    5591627 B2    9/2014

* cited by examiner

*Primary Examiner* — Tremesha S Willis
(74) *Attorney, Agent, or Firm* — Stites & Harbison, PLLC; Jeffrey A. Haeberlin; James R. Hayne

(57) ABSTRACT

An electrode embedded member includes a plate-shaped substrate made of a ceramic; an inner electrode embedded in the substrate; a terminal disposed at a position that overlaps the inner electrode in a thickness direction of the substrate and is farther than the inner electrode from the front surface of the substrate; an intermediate insulator embedded in the substrate between the inner electrode and the terminal and that is made of a ceramic; and a connection electrode disposed along an outer surface of the intermediate insulator and that connects the terminal and the inner electrode. When seen in the thickness direction of the substrate, a cutout portion is formed in the connection electrode located at least outside an overlapping region where the terminal and the connection electrode overlap. The substrate and/or the intermediate insulator penetrates the cutout portion, and thereby the substrate and the intermediate insulator are integrated with each other.

9 Claims, 7 Drawing Sheets

ELECTRODE EMBEDDED MEMBER

CROSS-REFERENCE TO RELATED APPLICATIONS

The present application claims priority to Japanese Patent Application Nos. 2017-209382, 2018-073635, and 2018-177024 filed on Oct. 30, 2017, Apr. 6, 2018, and Sep. 21, 2018, the disclosures of which are herein incorporated by reference in their entirety.

BACKGROUND OF THE INVENTION

1. Field of the Invention

The present invention relates to an electrode embedded member in which an inner electrode is embedded in a substrate made of a ceramic.

2. Description of the Related Art

To date, an electrode embedded member in which an inner electrode is embedded in a substrate made of a ceramic is known (see, for example, PTL 1). In the electrode embedded member, a connection member may be disposed beforehand at a portion where the inner electrode is to be connected to a terminal in order to prevent the inner electrode from being damaged when forming an insertion hole, for connecting the terminal to the inner electrode, in the substrate. The connection member can prevent the inner electrode from being damaged.

PATENT LITERATURE

PTL 1 is Japanese Patent No. 5591627.

In the electrode embedded member, a crack may be formed when an internal stress is induced at a corner portion of a connection interface, where the connection member and the terminal are connected to each other, due to thermal expansion of the terminal or the like. The crack may exert a negative effect on the inner electrode and an insulation layer having a front surface of the substrate. Accordingly, there is a problem in that, if the distance from the connection member to the front surface of the electrode embedded member is small, the yield in manufacturing the electrode embedded member decreases.

BRIEF SUMMARY OF THE INVENTION

In consideration of the circumstances described above, an object of the present invention is to provide an electrode embedded member that can suppress a negative effect of a crack or the like on an inner electrode or a front surface of a substrate.

[1] To achieve the object described above, an electrode embedded member according an aspect of the present invention includes a plate-shaped substrate that has a front surface and a back surface and that is made of a ceramic; an inner electrode that is embedded in the substrate; a terminal that is disposed at a position that overlaps the inner electrode in a thickness direction of the substrate, the position being farther than the inner electrode from the front surface of the substrate (i.e., a terminal disposed farther from the front surface of the substrate than the inner electrode and at a position that, when seen in a thickness direction of the substrate, overlaps the inner electrode); an intermediate insulator that is embedded in the substrate between the inner electrode and the terminal; and a connection electrode that is disposed along an outer surface of the intermediate insulator and that connects the terminal and the inner electrode to each other. When seen in the thickness direction of the substrate, a cutout portion that is a gap is formed in the connection electrode, the cutout portion being located at least outside of an overlapping region where the terminal and the connection electrode overlap. In other words, the connection electrode defines a gap that, when seen in the thickness direction of the substrate, is located at least outside of an overlapping region where the terminal and the connection electrode overlap. At least one of the substrate and the intermediate insulator penetrates into the cutout portion (i.e., the gap of the connection electrode), and thereby the substrate and the intermediate insulator are integrated with each other.

With the aspect of the present invention, even when a crack is formed in the intermediate insulator, the crack can be easily confined within the intermediate insulator, and it is possible to suppress a negative effect of the crack on the inner electrode and an insulation layer having the front surface of the substrate. Moreover, it is possible to improve adhesion between the intermediate insulator and the substrate. Here, the meaning of the term "integrated" includes a state in which the material of the substrate and the material of the intermediate insulator are sintered together.

[2] In the aspect of the present invention, preferably, in a direction along the front surface of the substrate, an outer edge of an end portion of the intermediate insulator on the terminal side is located outside of an outer edge of the overlapping region. In other words, the intermediate insulator has an end portion on the terminal side of the intermediate insulator, and in a direction along the front surface of the substrate, an outer edge of the end portion of the intermediate insulator is located outside of an outer edge of the overlapping region.

With the aspect of present invention, the end portion of the intermediate insulator on the terminal side is larger than the outer edge of the overlapping region. Therefore, even when a crack is formed from the outer edge of the overlapping region into the intermediate insulator due to thermal expansion of the terminal, it is possible to confine a negative effect of the crack within the intermediate insulator and to suppress a negative effect of the crack on the substrate or the inner electrode.

[3] In the aspect of the present invention, preferably, the intermediate insulator includes an expanding portion that gradually expands, from the overlapping region side toward the inner electrode side, in a direction away from a center line that passes through a center of the overlapping region and that extends along a thickness of the substrate. In other words, the intermediate insulator includes an expanding portion that gradually expands, from an overlapping region side of the intermediate insulator toward an inner electrode side of the intermediate insulator, in a direction away from a center line that passes through a center of the overlapping region and that extends along a thickness of the substrate.

With the aspect of the present invention, even when a crack is formed from the outer edge of the overlapping region into the intermediate insulator due to thermal expansion of the terminal, it is possible to easily confine a negative effect of the crack within the intermediate insulator and to appropriately suppress a negative effect of the crack on the substrate or the inner electrode.

[4] In the aspect of the present invention, preferably, when seen in the thickness direction of the substrate, the connection electrode is connected to the inner electrode at a position outside of the overlapping region.

With the aspect of the present invention, even when a crack is formed from the outer edge of the overlapping region into the intermediate insulator due to thermal expansion of the terminal, it is possible to easily confine a negative effect of the crack within the intermediate insulator and to appropriately suppress a negative effect of the crack on the substrate or the inner electrode.

[5] In the aspect of the present invention, preferably, the connection electrode includes a contracting portion that gradually contracts, from the expanding portion toward the inner electrode, in a direction closer to the center line. In other words, the connection electrode includes a contracting portion that gradually contracts, from the expanding portion of the intermediate insulator toward the inner electrode side of the intermediate insulator, in a direction toward the center line. Here, if a connection region where the connection electrode and the inner electrode are connected to each other is too large, the characteristics of the inner electrode may change. When the connection electrode is connected to the inner electrode at a position outside of the overlapping region, because the connection electrode includes the contracting portion that connects the expanding portion and the inner electrode, it is possible to adjust the characteristics of the inner electrode.

[6] In the aspect of the present invention, preferably, a through hole is formed in the inner electrode (i.e., the inner electrodes defines a through hole), at least one of the intermediate insulator and the substrate penetrates into the through hole, and thereby the intermediate insulator and the substrate are directly connected to each other.

With the aspect of the present invention, it is possible to further improve adhesion between the intermediate insulator and the substrate.

[7] An electrode embedded member according to an aspect of the present invention includes a plate-shaped substrate that has a front surface and a back surface and that is made of a ceramic; an inner electrode that is embedded in the substrate; a terminal that is disposed at a position that overlaps the inner electrode in a thickness direction of the substrate, the position being farther than the inner electrode from the front surface of the substrate (i.e., a terminal disposed farther from the front surface of the substrate than the inner electrode and at a position that, when seen in a thickness direction of the substrate, overlaps the inner electrode); an intermediate insulator that is embedded in the substrate between the inner electrode and the terminal; and a connection electrode that is disposed along an outer surface of the intermediate insulator and that connects the terminal and the inner electrode to each other. The connection electrode includes a helical extension piece that is disposed on an outer surface of the intermediate insulator. At least one of the substrate and the intermediate insulator penetrates into a helical gap defined by the extension piece, and thereby the substrate and the intermediate insulator are integrated with each other.

With the aspect of the present invention, even when a crack is formed in the intermediate insulator due to thermal expansion of the terminal, it is possible to easily confine a negative effect of the crack within the intermediate insulator and to appropriately suppress a negative effect of the crack on the substrate or the inner electrode. Moreover, the terminal and the inner electrode are connected to each other via the helical extension piece, and electrical connection can be reliably established. Moreover, it is possible to improve adhesion between the intermediate insulator and the substrate.

[8] An electrode embedded member according to an aspect of the present invention includes a plate-shaped substrate that has a front surface and a back surface and that is made of a ceramic; an inner electrode that is embedded in the substrate; a terminal that is disposed at a position that overlaps the inner electrode in a thickness direction of the substrate, the position being farther than the inner electrode from the front surface of the substrate (i.e., a terminal disposed farther from the front surface of the substrate than the inner electrode and at a position that, when seen in a thickness direction of the substrate, overlaps the inner electrode); an intermediate insulator that is embedded in the substrate between the inner electrode and the terminal; and a connection electrode that is disposed along an outer surface of the intermediate insulator and that connects the terminal and the inner electrode to each other. The connection electrode includes an electroconductive layer that is formed at least on the outer surface of the intermediate insulator. The substrate and the intermediate insulator are integrated with each other at a portion of the outer surface of the intermediate insulator on which the electroconductive layer is not formed.

With the aspect of the present invention, even when a crack is formed in the intermediate insulator due to thermal expansion of the terminal, it is possible to easily confine a negative effect of the crack within the intermediate insulator and to appropriately suppress a negative effect of the crack on the substrate or the inner electrode. Moreover, because the substrate and the intermediate insulator are integrated with each other at a portion of the outer surface of the intermediate insulator on which the electroconductive layer is not formed, it is possible to improve adhesion between the intermediate insulator and the substrate.

[9] In the aspect of the present invention, preferably, the inner electrode has a through hole at a position that overlaps the terminal in the thickness direction of the substrate. In other words, the inner electrode defines a through hole at a position that, when seen in the thickness direction of the substrate, overlaps the terminal.

With the aspect of the present invention, because the inner electrode has the through hole at the position that overlaps the terminal in the thickness direction, it is possible to further improve adhesion between the intermediate insulator and the substrate by using the through hole.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A. First Embodiment

Figure 1:
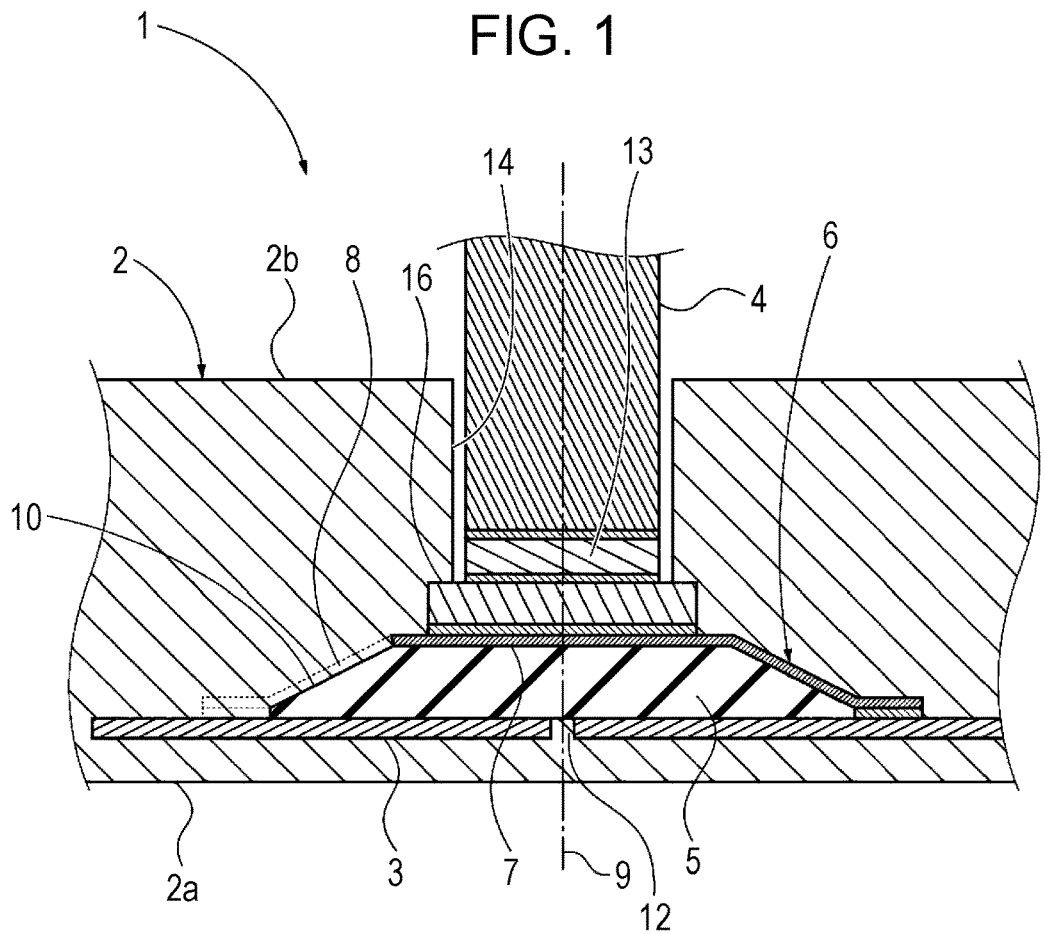
FIG. 1 is a sectional view of an electrode embedded member according to a first embodiment, taken along line I-I in FIG. 2.
Figure 2:
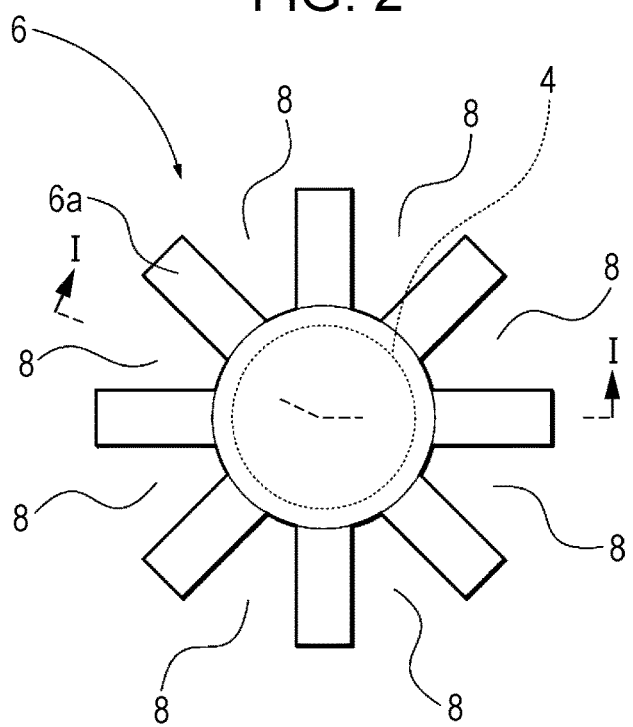
FIG. 2 is a plan view of a connection electrode according to the first embodiment.
Figure 3:
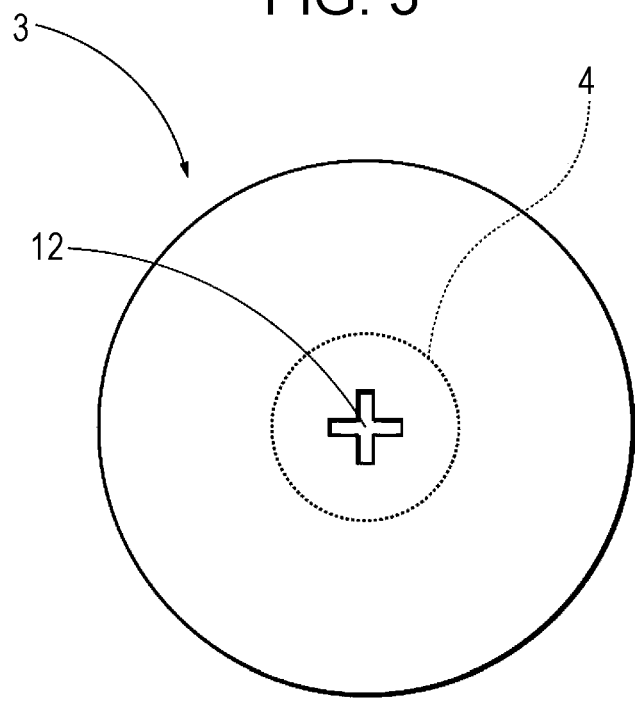
FIG. 3 illustrates a portion of an inner electrode according to the first embodiment on which a connection electrode is to be disposed.

Referring to FIGS. 1 to 3, an electrode embedded member 1 according to a first embodiment of the present invention will be described. The electrode embedded member 1 according to the first embodiment is a wafer holding device. The electrode embedded member 1 includes a plate-shaped substrate 2 that is made of a ceramic that is aluminum nitride to which yttrium oxide is added, an inner electrode 3 that is embedded in the substrate 2, a terminal 4, a truncated-cone-shaped intermediate insulator 5 that is made of a material a main component of which is (or all components of which are) the same as that (those) of the substrate 2, and a connection electrode 6. The substrate 2 and the intermediate insulator 5 may be made of another ceramic material whose main component is, for example, aluminum oxide ($Al_2O_3$), silicon carbide (SiC), silicon nitride ($Si_3N_4$), zirconium oxide ($ZrO_2$), or barium titanate ($BaTiO_3$).

The substrate 2 has a front surface 2a and a back surface 2b. The terminal 4 is disposed at a position farther than that of the inner electrode 3 from the front surface 2a. The intermediate insulator 5 is located between the inner electrode 3 and the terminal 4 and is embedded in the substrate 2. The connection electrode 6 is disposed along an outer surface of the intermediate insulator 5 and connects the terminal 4 and the inner electrode 3 to each other.

A portion of the connection electrode 6 to which the terminal 4 is connected will be referred to as a "connection interface 7" (which will be also referred to as an "overlapping region" in which the terminal 4 and the connection electrode 6 overlap in the thickness direction of the substrate 2). When seen in the thickness direction of the substrate 2, cutout portions 8, which are gaps that are located at least outside of the connection interface 7 where the terminal 4 and the connection electrode 6 are connected to each other, are formed in the connection electrode 6. At least one of the substrate 2 and the intermediate insulator 5 penetrates into the cutout portions 8, and thereby the substrate 2 and the intermediate insulator 5 are integrated with each other. Here, "integrated" includes a state in which the material of the substrate 2 and the material of the intermediate insulator 5 are sintered together.

The intermediate insulator 5 is configured such that the outer edge of an end portion of the intermediate insulator 5 on the terminal 4 side is located outside of the outer edge of the connection interface 7. The intermediate insulator 5 includes an expanding portion 10 that gradually expands, from the connection interface 7 side toward the inner electrode 3 side, in a direction away from a center line 9 that passes through the center of the connection interface 7 and that extends along a thickness of the substrate 2.

A through hole 12, which directly connects the intermediate insulator 5 and the substrate 2 to each other, is formed in the inner electrode 3.

Next, a method of manufacturing the electrode embedded member 1 according to the present embodiment will be described. First, in order to form an insulation layer, a die is filled with a powder mixture composed of 97% by mass of aluminum nitride powder and 3% by mass of yttrium oxide powder; and the powder mixture is uniaxially pressed. Thus, a first layer (insulation layer) having a diameter of 340 mm and a thickness of 5 mm is formed.

Next, on the first layer, a mesh structure (having a wire diameter of 0.1 mm and 50 meshes per inch) made of molybdenum and having a diameter of 290 mm is placed as the inner electrode 3. As illustrated in FIG. 3, in a portion of the inner electrode 3 that overlaps the terminal 4, the through hole 12, which is cross-shaped, is formed in a central part of the connection portion. By forming the through hole 12, it is possible to make the intermediate insulator 5, which is to be disposed later, strongly adhere to the first layer of the substrate 2. The through hole 12, which is formed in the inner electrode 3, can reduce a stress that is generated due to the difference in thermal expansion between the inner electrode 3 and the substrate 2 and exerted on an insulation layer, and has a positive effect in suppressing generation of a crack in the insulation layer. However, even when the through hole 12 is omitted, the advantageous effect of the present invention in suppressing a crack can be obtained.

Next, the intermediate insulator 5, which has formed to have a truncated-cone shape from the same material as the insulation layer, is disposed at a position on the inner electrode 3 to which the predetermined terminal 4 is to be connected. The truncated-cone-shaped intermediate insulator 5 has a top diameter of 16 mm, a base diameter of 30 mm, and a thickness of 2.5 mm. The circular outer edge of the top surface is chamfered.

Next, the connection electrode 6, which is made of a molybdenum mesh, is set. The connection electrode 6, which has a wire diameter of 0.1 mm and mesh count of 50, is bent beforehand into the outer shape of the intermediate insulator 5. Then, the connection electrode 6 is placed on the intermediate insulator 5, and the outer peripheral portion of the connection electrode 6 is made to closely adhere to the inner electrode 3. Moreover, a connection member 16, which is a tungsten pellet having a diameter of 10 mm and a thickness of 0.5 mm, is placed on the connection electrode 6. At this time, an electroconductive paste, such as a tungsten paste, may be applied to a portion of the inner electrode 3 to be connected to the connection electrode 6 and/or a portion of the connection electrode 6 to be connected to the connection member 16.

Next, a second layer is formed by applying ceramic powder onto the structure made through the process described above.

Next, a heater electrode is set. A heat-generating resistor element, which is composed of a molybdenum mesh (having a wire diameter of 0.1 mm and 50 meshes per inch) formed in a predetermined pattern in order to heat the electrode embedded member 1 as a wafer holding device, is disposed. Then, at a position where a predetermined heating terminal is to be disposed, the connection member 16 having a disk-like shape (made from a tungsten pellet and having a diameter of 10 mm and a thickness 0.5 mm) is placed.

Next, the process proceeds to a step of forming a compact before being fired. A third layer is formed by applying ceramic powder onto the structure on which the heater electrode has been set as described above.

Next, the process proceeds to a firing step. The compact described above is hot-press fired at a pressure of 10 MPa and a firing temperature of 1800° C. for 2 hours to form a ceramic sintered compact that is to become the substrate 2, having a diameter of 340 mm and a thickness of 20 mm. Due to the hot-press firing, the intermediate insulator 5 is deformed and the through hole 12 is filled, at least one of the substrate 2 and the intermediate insulator 5 penetrates into the through hole 12, and thereby the intermediate insulator 5 and the substrate 2 are integrated with and strongly adhere to each other.

Next, the process proceeds to a machining step after firing. By grinding and polishing the entire surface of the fired ceramic sintered compact, a wafer placement surface (front surface 2a) having a surface roughness Ra of 0.4 μm and including an insulation layer, which is a part of the substrate 2 between the inner electrode 3, having a thickness of 0.3 mm is formed.

Next, the process proceeds to a terminal forming step. A hole is formed from the back surface 2b of the substrate 2, which is made of a ceramic, until the hole reaches the connection member 16 at a position where each terminal is to be disposed, thereby forming a cylindrical insertion hole 14, which extends from the back surface 2b to reach the connection member 16. A buffer member 13, which has a diameter of 4 mm and a thickness of 2 mm and made of Kovar, is disposed on the connection member 16, which defines the insertion hole 14, via a brazing alloy that is an Au—Ni alloy to which Ti is added as an active metal. Next, the terminal 4, which has a cylindrical shape having a diameter of 5 mm and a length of 200 mm and which is made of nickel, is set on the buffer member 13 via a brazing alloy that is an Au—Ni alloy to which Ti is added as an active metal. Subsequently, brazing is performed by performing heating in a vacuum tunnel kiln at 1050° C., thereby completing the electrode embedded member 1. A brazing alloy that does not include an active metal may be used.

A heat cycle of heating the electrode embedded member 1, which has been manufactured as described above, to 700° C. and then cooling the electrode embedded member 1 to 100° C. was repeated 30 times. As a result, it was confirmed that a defect such as a crack was not generated in the electrode embedded member 1 according to the first embodiment.

As is clear from the above description, with the electrode embedded member 1 according to the first embodiment, it is possible to improve adhesion between the intermediate insulator 5 and the substrate 2 and to suppress a defect such as a crack in the insulation layer.

In the electrode embedded member 1 according to the present embodiment, the outer edge of an end portion of the intermediate insulator 5 on the terminal 4 side is located outside of the outer edge of the connection interface 7. Therefore, even when a crack is formed from the outer edge of the connection interface 7 into the intermediate insulator 5 due to thermal expansion of the terminal 4, it is possible to confine a negative effect of the crack within the intermediate insulator 5 and to suppress a negative effect of the crack on the substrate 2 or the inner electrode 3.

In the electrode embedded member 1 according to the present embodiment, the intermediate insulator 5 has a truncated-cone-shape that includes the expanding portion 10 that gradually expands, from the connection interface 7 side toward the inner electrode 3 side, in a direction away from the center line 9 that passes through the center of the connection interface 7 and that extends along a thickness of the substrate 2. Therefore, even when a crack is formed from the outer edge of the connection interface 7 into the intermediate insulator 5 due to thermal expansion of the terminal 4, it is possible to easily confine a negative effect of the crack within the intermediate insulator 5 and to appropriately suppress a negative effect of the crack on the substrate 2 or the inner electrode 3.

In the electrode embedded member 1 according to the present embodiment, when seen in the thickness direction of the substrate 2, the connection electrode 6 is connected to the inner electrode 3 at a position outside of the connection interface 7 in the radial direction of the substrate 2. With this structure, even when a crack is formed from the outer edge of the connection interface 7 into the intermediate insulator 5 due to thermal expansion of the terminal 4, it is possible to easily confine a negative effect of the crack within the intermediate insulator 5 and to appropriately suppress a negative effect of the crack on the substrate 2 or the inner electrode 3.

B. Second Embodiment

Figure 4:
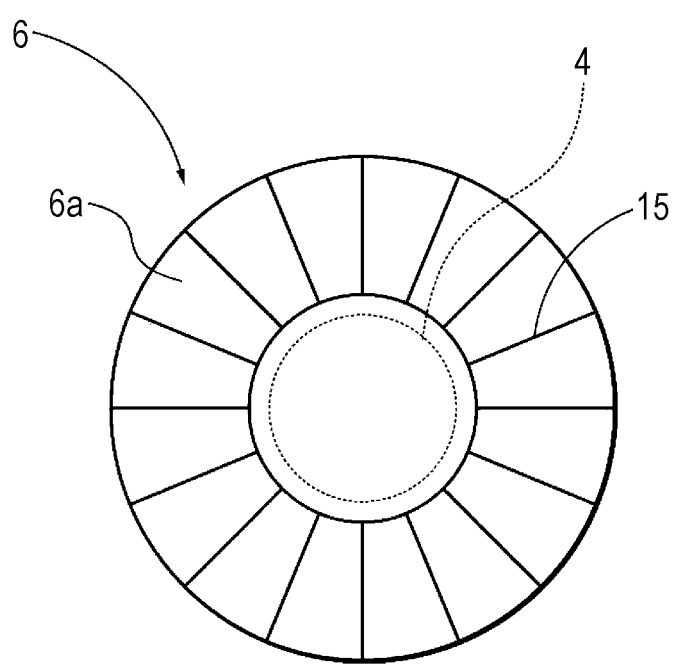
FIG. 4 illustrates a connection electrode according to a second embodiment.

As illustrated in FIG. 4, in an electrode embedded member 1 according to a second embodiment, slits 15, each of which is an example of a cutout portion, are formed in the connection electrode 6 by laser processing. Other elements are the same as those of the first embodiment. Also with the electrode embedded member 1 according to the second embodiment, compared with a case where cutout portions are not formed, at least a part of the substrate 2 and the intermediate insulator 5 penetrates into the slit 15, and thereby integrity of the intermediate insulator 5 and the substrate 2 can be improved. As a result, it is possible to obtain advantageous effects that are the same as those of the first embodiment.

C. Third Embodiment

Figure 5:
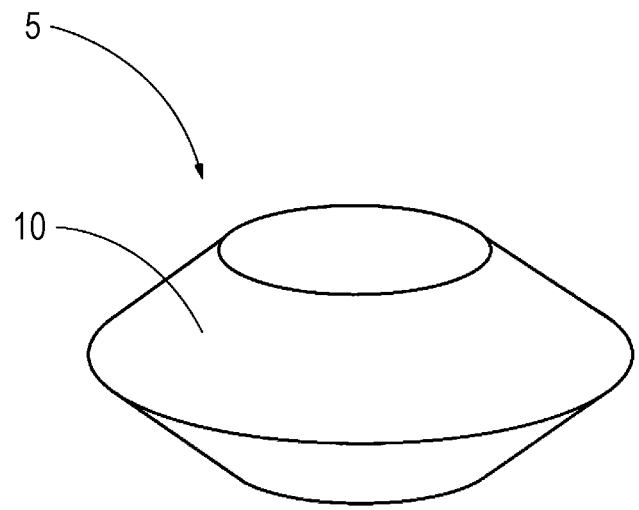
FIG. 5 is a perspective view of an intermediate insulator according to a third embodiment.
Figure 6:
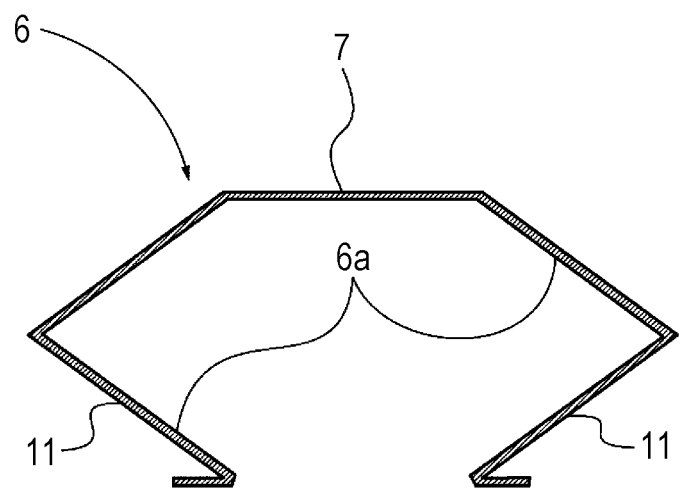
FIG. 6 is a sectional view of a connection electrode in a case where the intermediate insulator shown in FIG. 5 is used.

In the first embodiment and the second embodiment, the connection electrode 6 is connected to the inner electrode 3 at a position outside of the connection interface 7 when seen in the thickness direction of the substrate 2. However, as illustrated in FIG. 5, the intermediate insulator 5 may be formed so as to have a rhombic cross section, and the connection electrode 6 may include a contracting portion 11 (protruding piece 6a). As shown in a cross-sectional view in FIG. 6, the contracting portion 11 is disposed along the outer surface of the intermediate insulator 5 so as to cover the intermediate insulator 5 and contracts, from the expanding portion 10 toward the inner electrode, in a direction closer to the center line 9.

Here, if the connection region where the connection electrode 6 and the inner electrode 3 are connected to each other is too large, the characteristics (such as the impedance characteristic) of the inner electrode 3 as a high-frequency electrode may change. However, by providing the contracting portion 11 to the connection electrode 6 as described above, it is possible to adjust the connection region between the connection electrode 6 and the inner electrode 3, and it is possible to adjust the characteristics of the inner electrode 3.

D. Fourth Embodiment

Figure 7:
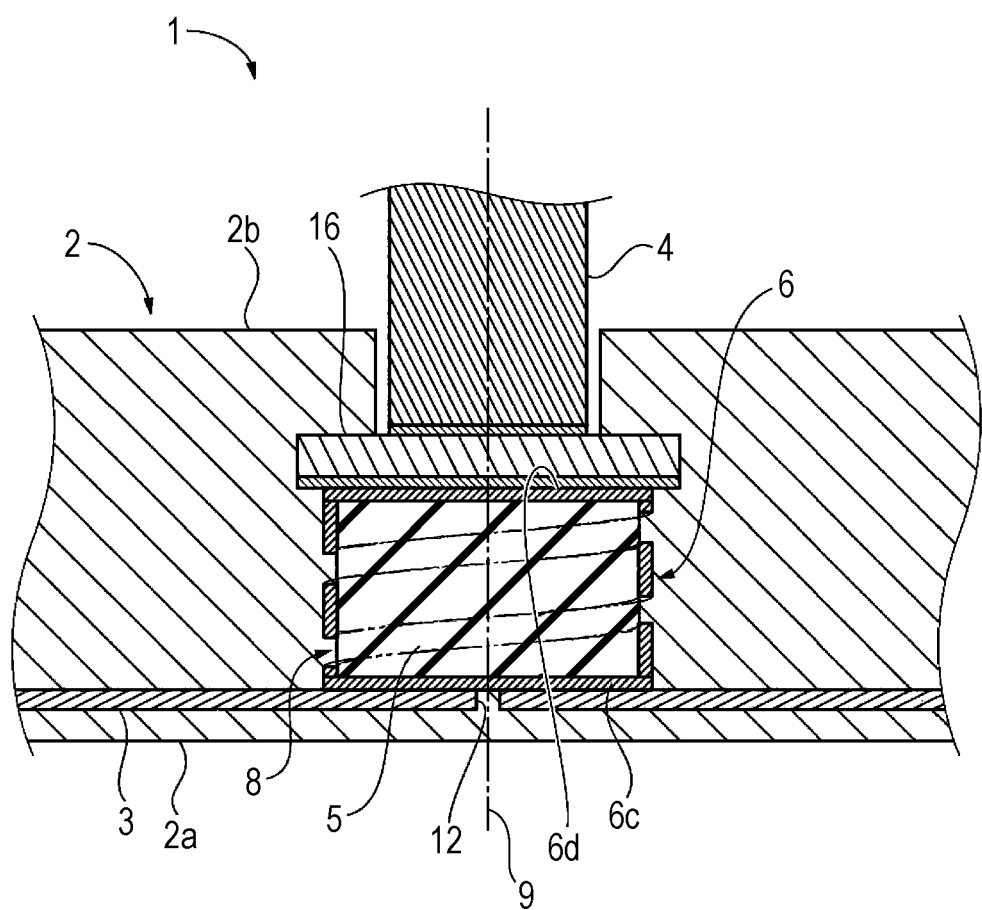
FIG. 7 schematically illustrates an electrode embedded member according to a fourth embodiment.
Figure 8A:
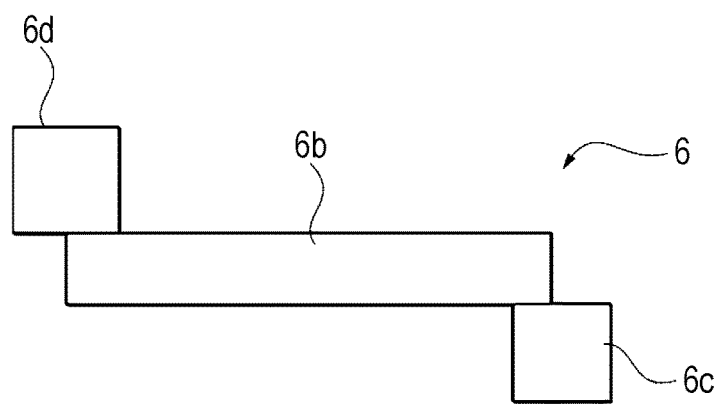
FIG. 8A is a development view of a connection electrode according to the fourth embodiment.
Figure 8B:
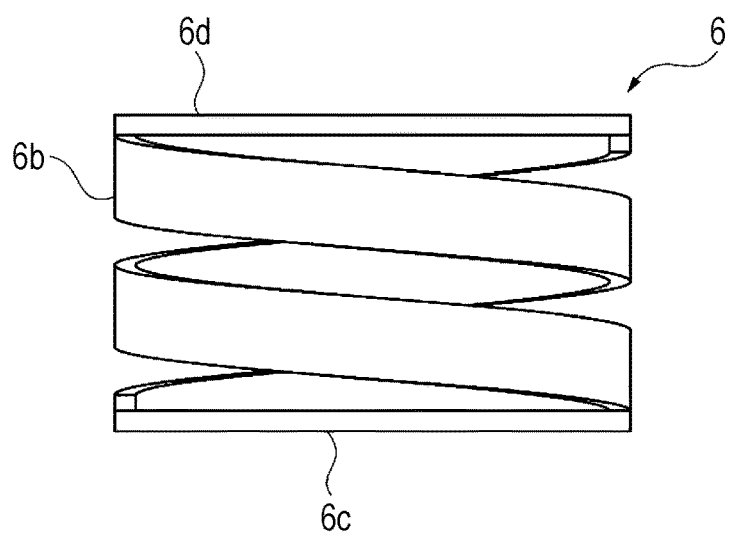
FIG. 8B is a side view of a connection electrode according to the fourth embodiment.
Figure 9:
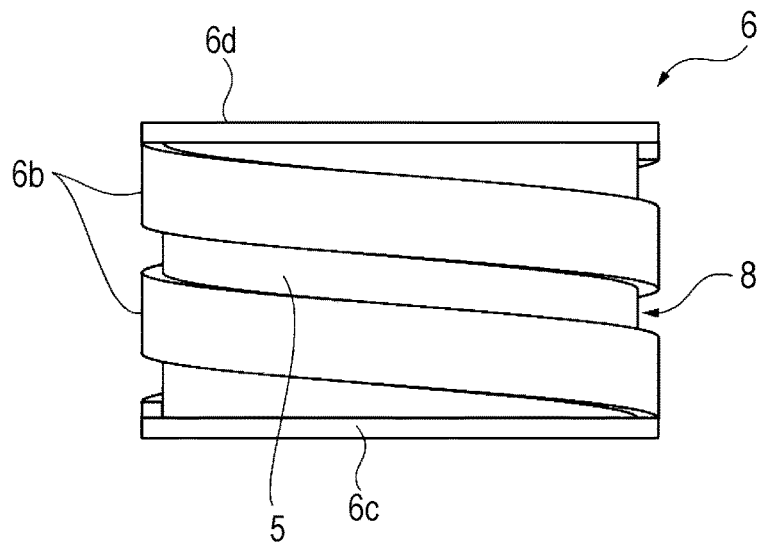
FIG. 9 is side view of an intermediate insulator and the connection electrode according to the fourth embodiment.

Referring to FIGS. 7 to 9, an electrode embedded member 1 according to a fourth embodiment of the present invention will be described. The intermediate insulator 5 is cylindrical. The connection electrode 6 includes one end portion 6d, an extension piece 6b extending from the one end portion 6d, and the other end portion 6c that is formed at an end portion of the extension piece 6b opposite to the one end portion 6d. The one end portion 6d is disposed on one end surface of the intermediate insulator 5, the extension piece 6b is helically wound around the outer surface of the intermediate insulator 5, and the other end portion 6c is disposed on the other end surface of the intermediate insulator 5.

As described above, the terminal 4 and the inner electrode 3 are electrically connected to each other by the connection electrode 6 having the helical extension piece 6b. Moreover, at least one of the substrate 2 and the intermediate insulator 5 penetrates into a gap 8 defined by the extension piece 6b, and thereby the substrate 2 and the intermediate insulator 5 are integrated with each other. Therefore, it is possible to improve adhesion between the intermediate insulator 5 and the substrate 2.

In the thickness direction of the substrate 2, the extension piece 6b of the connection electrode 6, which is helically formed, and the gap 8 are alternately arranged. In the fourth embodiment, the width of the helical extension piece 6b in the helix axis direction is larger than the width of the helical gap 8 in the helix axis direction. However, this is not a limitation. The width of the helical extension piece 6b in the helix axis direction may be smaller than the width of the helical gap 8 in the helix axis direction, the width of the helical extension piece 6b in the helix axis direction may be equal to the width of the helical gap 8 in the helix axis direction, or the width of the helical extension piece 6b in the helix axis direction and the width of the helical gap 8 in the helix axis direction may be irregular.

In the fourth embodiment, the width of the extension piece 6b, which forms a helix, is uniform. However, this is not a limitation. The width of the extension piece 6b may be larger in a part thereof on the terminal 4 side than in a part thereof on the inner electrode 3 side, may be smaller in a part thereof on the terminal 4 side than in a part thereof on the inner electrode 3 side, or may be irregular. Further alternatively, the extension piece 6b may be shaped like a wire. The number of turns of the helix around the intermediate insulator 5 may be any appropriate number, such as one, two, three, or a half. The winding direction of the helix may be right-handed or left-handed.

In the fourth embodiment, the intermediate insulator 5 has a cylindrical shape. However, this is not a limitation. As illustrated in FIG. 1, the intermediate insulator 5 may be configured such that the outer edge of an end portion thereof on the terminal 4 side is located outside of the outer edge of the connection interface 7. As illustrated in FIG. 5, the intermediate insulator 5 may be configured so as to have a rhombic cross section.

In the fourth embodiment, the buffer member 13, which is an element described in the first to third embodiments, is not provided. However, the buffer member 13 described in the first to third embodiments may be provided in the fourth embodiment.

Next, a method of manufacturing the electrode embedded member 1 according to the present embodiment will be schematically described. Descriptions of steps, elements, and the like that are common to those of the first embodiment will be omitted.

The electrode embedded member 1 according to the present embodiment can be manufactured by using, for example, any of the following methods: a method of hot-press firing and thereby integrating a plurality of members in each of which an inner electrode and a connection member are embedded in a compact (green compact) obtained by cold isostatic press (CIP) (hereinafter, this method may be also referred to as a "compact pressing method"); a powder pressing method of compacting a powder material by hot-press firing; and a method that is a combination of the compact pressing method and the powder pressing method. In the following description, it is assumed that the compact pressing method is used. First, a powder mixture composed of 95% by mass of aluminum nitride powder and 5% by mass of yttrium oxide powder is cold isostatically pressed (CIP). Subsequently, the obtained compact is processed. Thus, a first layer (insulation layer) and a second layer are formed. After forming a predetermined hole in the second layer, a connection member 16, which is made from a tungsten pellet, is placed on the bottom of the hole.

Next, the connection electrode 6, which is made from a molybdenum mesh, is cut into a predetermined shape and wound around the intermediate insulator 5. The intermediate insulator 5 is placed in contact with the connection member 16; the inner electrode 3, which is a molybdenum mesh structure, is placed on the intermediate insulator 5; a first layer is placed on the inner electrode 3; these members are integrated with each other; and then hot-press firing is performed while uniaxially pressing the integrated members from the front surface and the back surface thereof.

Next, after firing, the front surface 2a on the first layer side and the back surface 2b on the second layer side are formed by performing predetermined outer-shape machining. Then, a hole is formed so that the connection member 16 is exposed from the back surface 2b side, and the terminal 4 is brazed to the connection member 16 by using a predetermined member.

With the electrode embedded member 1 according to the fourth embodiment, even when a crack is formed in the intermediate insulator 5 due to thermal expansion of the terminal 4, it is possible to easily confine a negative effect of the crack within the intermediate insulator 5 and to appropriately suppress a negative effect of the crack on the substrate 2 or the inner electrode 3.

E. Fifth Embodiment

Figure 10:
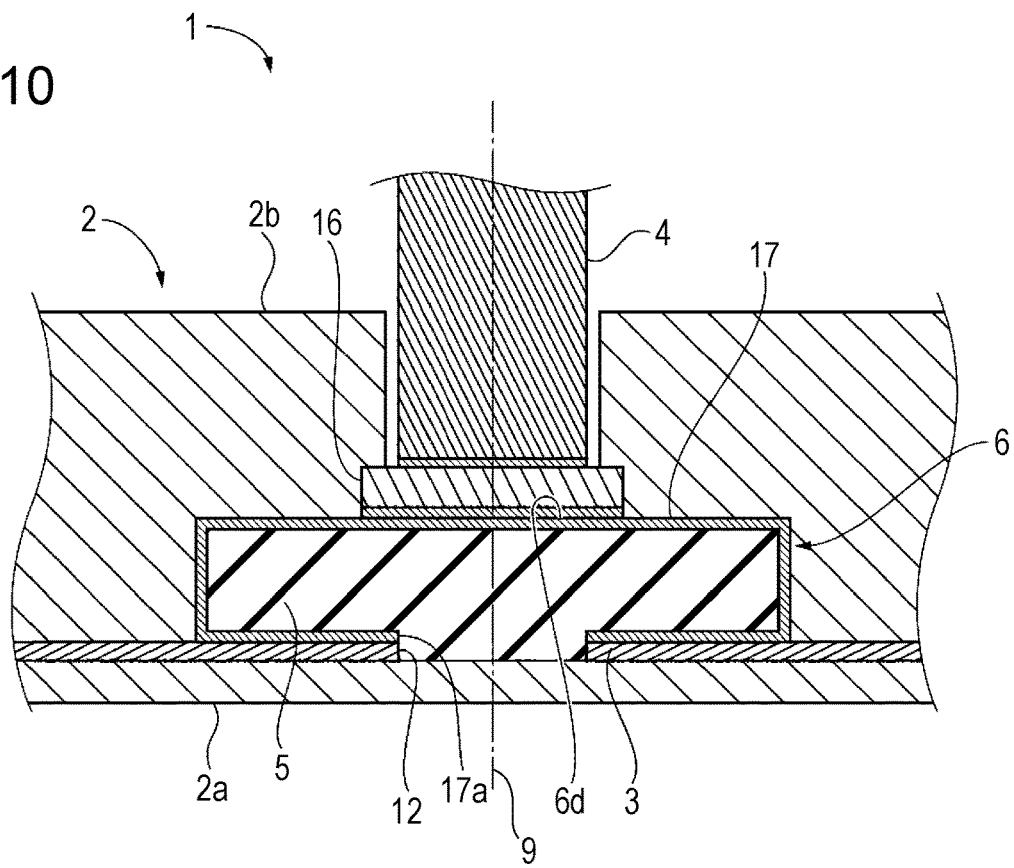
FIG. 10 schematically illustrates an electrode embedded member according to a fifth embodiment.

Next, a fifth embodiment will be described. Descriptions of elements and the like that are common to those of the first embodiment will be omitted. As illustrated in FIG. 10, a connection electrode 17 includes an electroconductive layer that is formed at least on an outer surface of the intermediate insulator 5 by application of an electroconductive paste including tungsten. The substrate 2 and the intermediate insulator 5 are integrated with each other at a portion 17a of the outer surface of the intermediate insulator 5 on which the electroconductive layer is not formed.

The intermediate insulator 5 includes a first cylindrical portion and a second cylindrical portion. The first cylindrical portion is located in the substrate 2 on the back surface 2b side and has a diameter larger than the diameter of the terminal 4. The second cylindrical portion is located in the substrate 2 on the front surface 2a side, is integrated with the first cylindrical portion, and has a diameter smaller than the diameter of the first cylindrical portion. The height of the second cylindrical portion is equal to the sum of the thickness of the electroconductive layer of the connection electrode 17 and the thickness of the inner electrode 3.

The connection electrode 17 includes the portion (gap) 17a, in which an electroconductive layer is not formed, at a position that overlaps the terminal 4 in the thickness direction of the substrate 2. The inner electrode 3 has a through hole 12 at a position that overlaps the terminal 4 in the thickness direction of the substrate 2. The portion 17a of the connection electrode 17 in which the electroconductive layer is not formed has the same shape as the through hole 12 of the inner electrode 3. The second cylindrical portion is formed so as to extend through the portion 17a in which the electroconductive layer is not formed and the through hole 12. The connection electrode 17 is formed on the surface of the first cylindrical portion so as to extend to a portion that contacts the second cylindrical portion.

As described above, the portion (gap) 17a of the connection electrode 17 in which the electroconductive layer is not formed and the through hole 12 of the inner electrode 3 overlap in the thickness direction. Therefore, the substrate 2 and the intermediate insulator 5 can be strongly integrated with each other.

In the fifth embodiment, the portion 17a of the connection electrode 17 in which the electroconductive layer is not formed has the same shape as the through hole 12 of the inner electrode 3. However, this is not a limitation. The portion 17a of the connection electrode 17 in which the electroconductive layer is not formed may have a shape different from that of the through hole 12 of the inner electrode 3. The portion 17a of the connection electrode 17 in which the electroconductive layer is not formed may be larger than the through hole 12 of the inner electrode 3, and the second cylindrical portion of the intermediate insulator 5 may be composed of a step portion that is inserted into the portion 17a of the connection electrode 17 in which the electroconductive layer is not formed and a step portion that is inserted into the through hole 12 of the inner electrode 3. The second cylindrical portion may be an independent member, and the first and second cylindrical portions may be stacked on top of each other.

F. Sixth Embodiment

Figure 11:
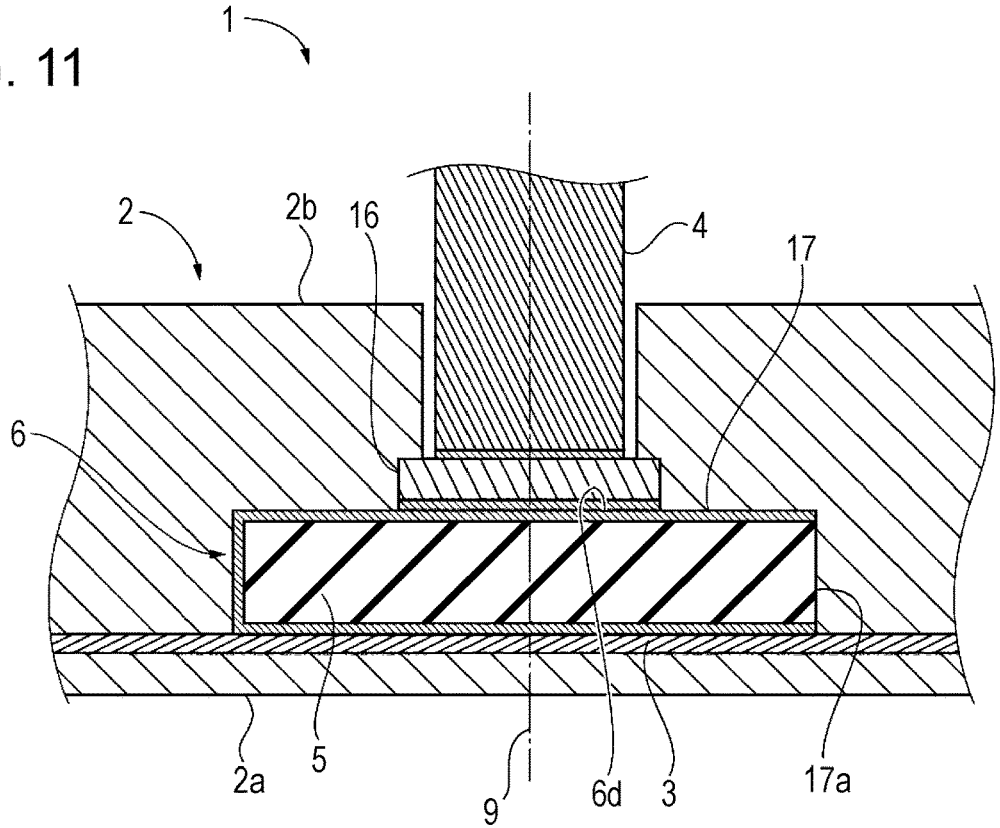
FIG. 11 schematically illustrates an electrode embedded member according to a sixth embodiment.

Next, a sixth embodiment will be described. Descriptions of elements and the like that are common to those of the fifth embodiment will be omitted. As illustrated in FIG. 11, the intermediate insulator 5 includes a thin cylindrical portion that has a diameter larger than the diameter of the terminal 4 and a height smaller than the diameter thereof. The connection electrode 17 is formed on both end surfaces and a part of the outer peripheral surface of the cylindrical portion. The connection electrode 17 includes a portion (gap) 17a, in which electroconductive layer is not formed, in a direction perpendicular to (lateral to) the thickness direction of the substrate 2. The inner electrode 3 does not have a through hole 12.

As described above, the connection electrode 17 includes the portion (gap) 17a in which electroconductive layer is not formed in a lateral part thereof. Therefore, the substrate 2 and the intermediate insulator 5 can be integrated with each other. Moreover, it is possible to increase or decrease the area of the portion (gap) 17a of the connection electrode 17 in which electroconductive layer is not formed on the lateral side, as long as electrical connection can be established. By increasing the area of the portion (gap) 17a in which electroconductive layer is not formed, the substrate 2 and the intermediate insulator 5 can be more strongly integrated with each other.

G. Seventh Embodiment

Figure 12:
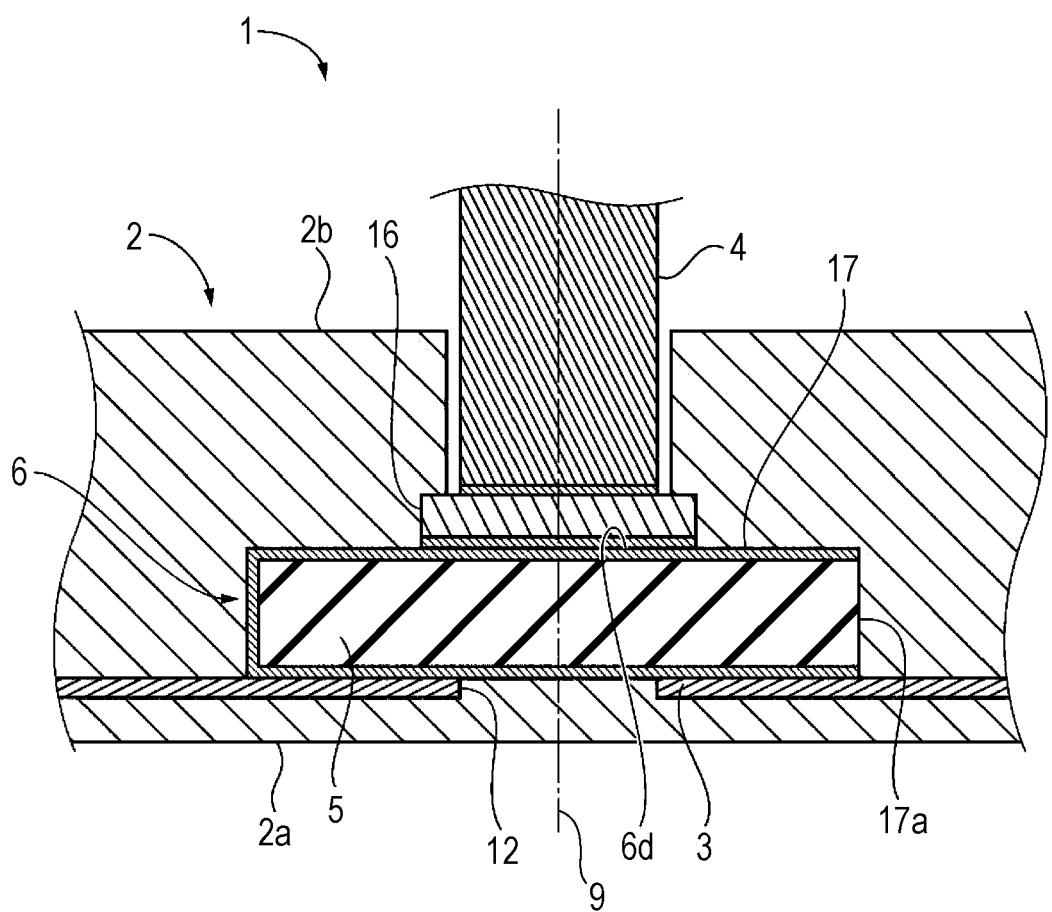
FIG. 12 schematically illustrates an electrode embedded member according to a seventh embodiment.

Next, a seventh embodiment will be described. Descriptions of elements and the like that are common to those of the fifth embodiment will be omitted. As illustrated in FIG. 12, the intermediate insulator 5 includes a thin cylindrical portion that has a diameter larger than the diameter of the terminal 4 and a height smaller than the diameter thereof. The connection electrode 17 is formed on both end surfaces and a part of the outer peripheral surface of the cylindrical portion. The connection electrode 17 includes a portion (gap) 17a, in which electroconductive layer is not formed, in a direction perpendicular to (lateral to) the thickness direction of the electrode embedded member 1. The inner electrode 3 has a through hole 12 at a position that overlaps the terminal 4 in the thickness direction.

As described above, the connection electrode 17 includes the portion (gap) 17a in which electroconductive layer is not formed in a lateral part thereof. Therefore, the substrate 2 and the intermediate insulator 5 can be integrated with each other.

In the embodiments, the cutout portions 8, each of which is disposed between adjacent protruding pieces 6a, of the first embodiment; and the slits 15 of the second embodiment have been described as a cutout portion. However, a cutout portion according to the present invention is not limited to these and may be another structure, as long as the cutout portion can directly connect the substrate 2 and the intermediate insulator 5 to each other. For example, the cutout portion may be circular through holes that are formed with intervals so as extend through the connection electrode.

In the embodiments, the substrate 2 and the intermediate insulator 5 are made of the same material. However, a substrate and an intermediate insulator may be made of different materials, as long as the materials are ceramics and can be integrated with each other by being pressed and fired. For example, the substrate and the intermediate insulator may be made of materials whose main components are the same but additives are different. Also in this case, integrity of the substrate and intermediate insulator can be improved.

The intermediate insulator may be a calcine made by calcinating a compact or a sintered compact.

The inner electrode 3 and the connection electrode 6 described above are made of molybdenum, the connection member 16 is made of tungsten, and the terminal 4 is made of nickel. However, the materials of an inner electrode, a connection electrode, a connection member, and a terminal in the present invention are not limited to these. For example, the inner electrode may be made of tungsten or a tungsten alloy; the connection electrode may be made of a tungsten alloy, molybdenum, or a molybdenum alloy; the connection member may be made of molybdenum, a molybdenum alloy, a tungsten alloy, Kovar, a nickel alloy; and/or the terminal may be made of a nickel alloy, titanium, or a titanium alloy.

What is claimed is:

1. An electrode embedded member comprising:
   a plate-shaped substrate having a front surface and a back surface, the substrate made of a ceramic;
   an inner electrode embedded in the substrate;
   a terminal disposed farther from the front surface of the substrate than the inner electrode and at a position that, when seen in a thickness direction of the substrate, overlaps the inner electrode;
   an intermediate insulator embedded in the substrate between the inner electrode and the terminal; and
   a connection electrode disposed along an outer surface of the intermediate insulator, the connection electrode connecting the terminal and the inner electrode to each other, the connection electrode defining a gap that, when seen in the thickness direction of the substrate, is located at least outside of an overlapping region where the terminal and the connection electrode overlap, wherein at least one of the substrate and the intermediate insulator penetrates the gap of the connection electrode, and thereby the substrate and the intermediate insulator are integrated with each other.

2. The electrode embedded member according to claim 1, wherein, the intermediate insulator has an end portion on the terminal side of the intermediate insulator, and in a direction along the front surface of the substrate, an outer edge of the end portion of the intermediate insulator is located outside of an outer edge of the overlapping region.

3. The electrode embedded member according to claim 2, wherein the intermediate insulator includes an expanding portion that gradually expands, from an overlapping region side of the intermediate insulator toward an inner electrode side of the intermediate insulator, in a direction away from a center line that passes through a center of the overlapping region and that extends along a thickness of the substrate.

4. The electrode embedded member according to claim 3, wherein, when seen in the thickness direction of the substrate, the connection electrode is connected to the inner electrode at a position outside of the overlapping region.

5. The electrode embedded member according to claim 3, wherein the connection electrode includes a contracting portion that gradually contracts, from the expanding portion of the intermediate insulator toward the inner electrode side of the intermediate insulator, in a direction toward the center line.

6. The electrode embedded member according to claim 1, wherein the inner electrode defines a through hole, at least one of the intermediate insulator and the substrate penetrates the through hole, and thereby the intermediate insulator and the substrate are directly connected to each other.

7. An electrode embedded member comprising:
a plate-shaped substrate having a front surface and a back surface, the substrate made of a ceramic;
an inner electrode embedded in the substrate;
a terminal disposed farther from the front surface of the substrate than the inner electrode and at a position that, when seen in a thickness direction of the substrate, overlaps the inner electrode;
an intermediate insulator embedded in the substrate between the inner electrode and the terminal; and
a connection electrode disposed along an outer surface of the intermediate insulator, the connection electrode connecting the terminal and the inner electrode to each other, the connection electrode including a helical extension piece disposed on an outer surface of the intermediate insulator, the helical extension piece defining a helical gap,
wherein at least one of the substrate and the intermediate insulator penetrates the helical gap, and thereby the substrate and the intermediate insulator are integrated with each other.

8. An electrode embedded member comprising:
a plate-shaped substrate having a front surface and a back surface, the substrate made of a ceramic;
an inner electrode embedded in the substrate;
a terminal disposed farther from the front surface of the substrate than the inner electrode and at a position that, when seen in a thickness direction of the substrate, overlaps the inner electrode;
an intermediate insulator embedded in the substrate between the inner electrode and the terminal; and
a connection electrode disposed along an outer surface of the intermediate insulator and that connects the terminal and the inner electrode to each other, the connection electrode including an electroconductive layer formed at least on the outer surface of the intermediate insulator,
wherein the substrate and the intermediate insulator are integrated with each other at a portion of the outer surface of the intermediate insulator on which the electroconductive layer is not formed.

9. The electrode embedded member according to claim 8, wherein the inner electrode defines a through hole at a position that, when seen in the thickness direction of the substrate, overlaps the terminal.

* * * * *